(12) United States Patent
Galambos et al.

(10) Patent No.: US 6,660,648 B1
(45) Date of Patent: Dec. 9, 2003

(54) PROCESS FOR MANUFACTURE OF SEMIPERMEABLE SILICON NITRIDE MEMBRANES

(75) Inventors: Paul Charles Galambos, Albuquerque, NM (US); Randy J. Shul, Albuquerque, NM (US); Christi Gober Willison, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 298 days.

(21) Appl. No.: 09/678,418

(22) Filed: Oct. 2, 2000

(51) Int. Cl.[7] .............................................. H01L 21/302
(52) U.S. Cl. ...................................... 438/714; 438/724
(58) Field of Search ................................ 438/706, 714, 438/719, 723, 724

(56) References Cited

U.S. PATENT DOCUMENTS

| | | | | |
|---|---|---|---|---|
| 3,773,567 A | * | 11/1973 | Gillespie | 438/94 |
| 5,543,046 A | * | 8/1996 | Van Rijn | 210/490 |
| 5,722,442 A | * | 3/1998 | Hoffman et al. | 134/102.1 |
| 5,843,520 A | * | 12/1998 | Liu | 427/124 |
| 5,930,669 A | * | 7/1999 | Uzoh | 438/627 |
| 5,935,877 A | * | 8/1999 | Autryve | 438/714 |
| 5,962,081 A | * | 10/1999 | Ohman et al. | 216/2 |
| 6,334,856 B1 | * | 1/2002 | Allen et al. | 128/898 |

* cited by examiner

Primary Examiner—Kin-Chan Chen
(74) Attorney, Agent, or Firm—Brian W. Dodson; John P. Hohimer

(57) ABSTRACT

A new class of semipermeable membranes, and techniques for their fabrication, have been developed. These membranes, formed by appropriate etching of a deposited silicon nitride layer, are robust, easily manufacturable, and compatible with a wide range of silicon micromachining techniques.

8 Claims, 2 Drawing Sheets

PROCESS FOR MANUFACTURE OF SEMIPERMEABLE SILICON NITRIDE MEMBRANES

GOVERNMENT RIGHTS

This invention was made with Government support under Contract DE-AC04-94AL85000 awarded by the U.S. Department of Energy. The Government has certain rights in the invention.

FIELD OF THE INVENTION

The present invention relates generally to porous membranes, and more particularly to semipermeable membranes and techniques for fabrication thereof.

BACKGROUND OF THE INVENTION

The development of practical microfluidic devices is currently hampered by phenomena that effect the reliability and manufacturability of these devices. Among these troublesome phenomena are processes associated with the introduction of unwanted constituents into microscopic flow channels, thereby interfering with the intended functionality of the device. These constituents include such entities as air bubbles and solid microparticles in liquid flow channels. A filtration system that can eliminate such unwanted constituents, and which can be co-fabricated with surface micromachined devices would greatly enhance the reliability of microfluidic apparatus.

A natural candidate for the heart of such a filtration system is a semipermeable membrane. Although such membranes are commonly thought of as being able to pass gases while preventing the passage of fluids. More generally, however, the term can be used to describe any membrane for which the membrane permeability differs significantly for fluids of interest. Semipermeable membranes can thus be used to separate fluid components, perform dialysis or osmosis. The selectivity of a membrane can be induced by physical configuration, including size (small molecules pass, large ones don't) and shape (skinny molecules pass, fat ones don't), by surface chemistry (different species bond to the membrane surface with different strengths), or by a combination of these factors.

Semipermeable membranes are currently made in many ways. Perhaps the oldest approach is to make a thin sheet of a binary alloy, and then expose the sheet to a chemical agent which preferentially dissolves one of the two metals making up the alloy. If the alloy concentration and the degree of attach by the chemical agent are correct, the result will be a porous metallic sheet, where the pores are nearly on an atomic scale.

It is more common today to make semipermeable membranes from polymers. Although polymer alloy fabrication techniques similar to those used on the metallic alloy membranes above can be used, often a controlled stretching process is all that is required.

The practical problem is that both polymer-based and metal-based semipermeable membranes are incompatible with current surface micromachining techniques, making it very difficult to incorporate these semipermeable membranes into such devices. However, if a filtration device can be co-fabricated with a surface micromachined microfluidic device, the overall process is greatly simplified.

A porous polysilicon-based membrane has been previously fabricated. In this process, a layer of silicon dioxide is deposited, and patterned into small localized deposits. These deposits are then embedded in polysilicon by growing a polysilicon layer atop the deposits. The membrane is then made porous by removing the silicon dioxide using a preferential etch. However, this technique is quite difficult to implement, and cannot produce semipermeable membranes—the pores which result from the patterning process are simply too wide and lack the convolutions which allow the length of the pores to be large.

There is thus a well-established need for a semipermeable membrane which can be readily co-fabricated with a surface micromachined microfluidic device. The fabrication process should allow production of membranes with a wide range of permeabilities.

SUMMARY OF THE INVENTION

The invention is of a new type of semipermeable membrane and fabrication processes therefor. These membranes comprise porous silicon nitride sheets, where the porosity is induced by a dry reactive ion etch. The permeability of such membranes can be controlled during fabrication by changing the degree of exposure to the etching process. Semipermeable membranes have been made which allow gases to freely pass, but not fluids. Such membranes have potential applications in gas/fluid/particle filtration, and in separation of physically and chemically distinct species.

BRIEF DESCRIPTION OF THE DRAWINGS

FIG. 2a shows the initial structure. FIG. 2b shows the initial structure after an etch stop layer has been applied. FIG. 2c shows the structure after a set of apertures has been etched through the substrate. FIG. 2d shows the final semipermeable structure.

DETAILED DESCRIPTION

The need for a semipermeable membrane which is compatible with silicon micromachining techniques is addressed by the instant invention, which provides for fabrication of a robust semipermeable membrane from a layer of silicon nitride. This fabrication can be accomplished using standard silicon micromachining capabilities. The resulting structure appears to be unique to this fabrication process.

A specific implementation of the instant process is described below. This description is not intended to limit the scope of the invention beyond the limitations of the claims, but rather to explain and illuminate the meaning of those claims.

Figure 1:
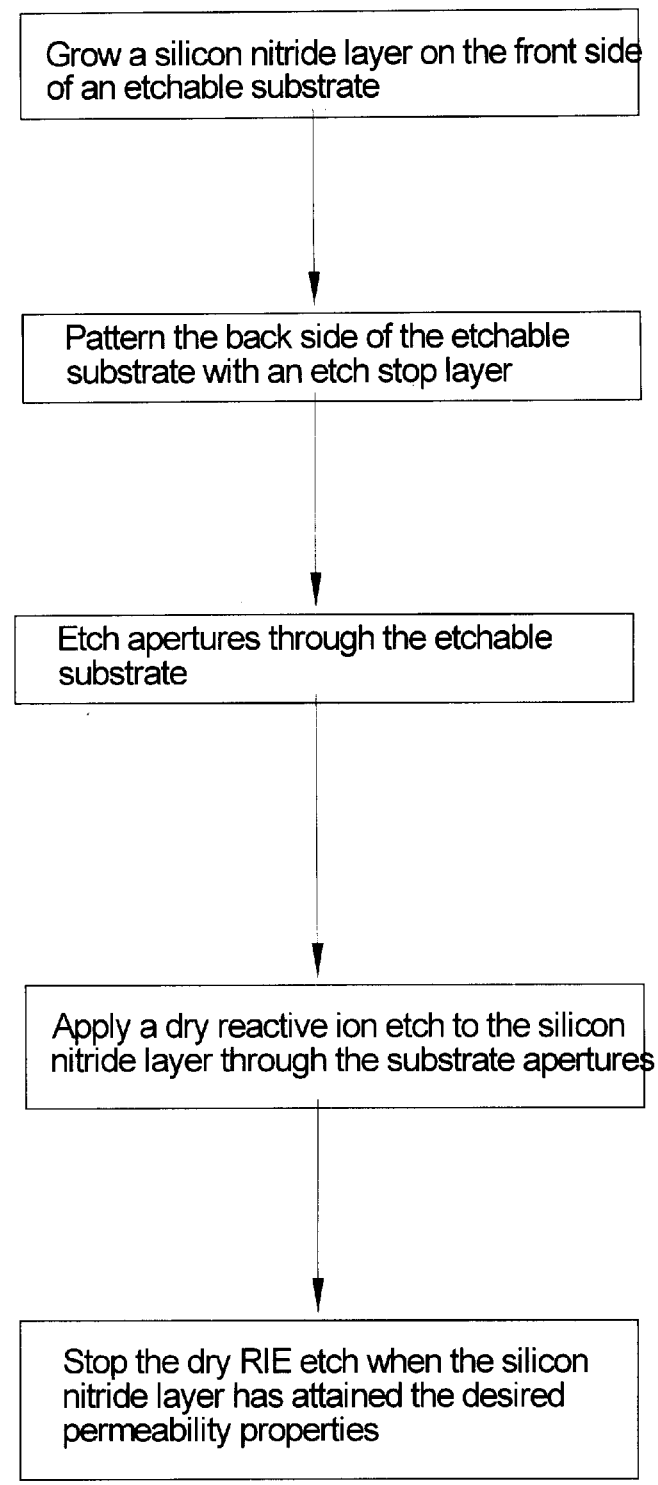
FIG. 1 shows a flow diagram of a specific implementation of the instant process for fabrication of a semipermeable silicon nitride membrane.
Figure 2:
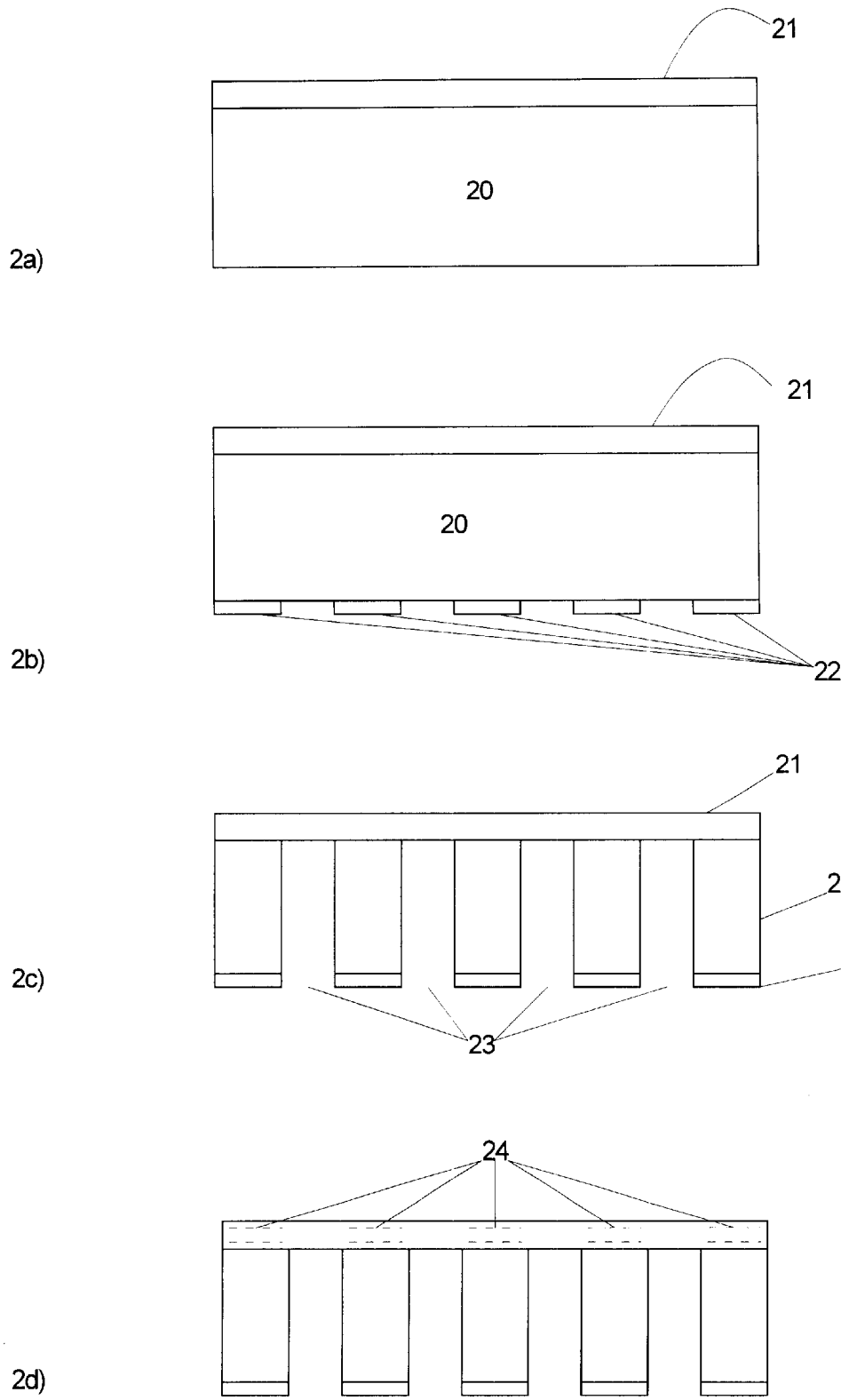
FIG. 2 shows a series of intermediate structures produced during fabrication of a semipermeable silicon nitride membrane according to FIG. 1.

FIG. 1 shows a schematic flow diagram of a specific implementation of the instant process. FIG. 2 shows intermediate structures produced during the fabrication process. One begins by growing a layer 21 of silicon nitride on the front side of an etchable substrate 20, producing the structure of FIG. 2a. This silicon nitride layer 21 is typically less than 1 micron in thickness, but can be as thick as 10 microns.

An etch stop pattern 22 is deposited on the rear side of the etchable substrate 20, producing the structure of FIG. 2b. A selective etch, which removes the material of the etchable substrate 20, but to which the silicon nitride layer 21 and the etch stop pattern 22 are essentially inert, is then applied to the rear surface. The result is that apertures 23 through the etchable substrate 20 to the silicon nitride layer 21 are formed, as shown in FIG. 2c.

Note that the nature of the selective etch used to produce the apertures 23 in the etchable substrate 20 has a strong influence on the exact structure at this step in the process. The portion of the substrate not removed in fabricating apertures 23 remains as a substrate structural support network. This network can be closely spaced as shown in FIG. 2, or can simply result from forming a single aperture in the substrate, thereby producing a nearly freestanding silicon nitride layer which is only supported at the edges.

If the selective etch is also directional in the material of the etchable substrate, apertures 23 can have straight walls leading through the etchable substrate 20. If not, apertures 23 will undercut the etch stop pattern 22, and the duration of the selective etching process will be an important process parameter.

In the next fabrication step, a silicon nitride etch is applied to the silicon nitride layer 21. The most robust semipermeable structures 24 will generally result if the silicon nitride etch is applied through apertures 23, but suitable structures can be made by applying the silicon nitride etch to just the front surface of the silicon nitride layer 21, or to both the front surface and through the apertures 23 simultaneously.

It is not clear what combination of microstructure and etching characteristics cause the etching of the silicon nitride layer 21 to produce a semipermeable structure, rather than simply etching uniformly through the silicon nitride. Applicants have found that a dry plasma etch produces semipermeable silicon nitride membranes from the structure of FIG. 2c reliably, and with reproducible permeability properties.

In a particular experiment, Applicants formed a 0.6 micron silicon nitride layer atop a standard silicon substrate. Apertures were cut through the substrate using a Bosch etch process, which produces nearly vertical walls, and automatically stops on reaching the silicon nitride layer.

The etching of the silicon nitride layer to produce the semipermeable silicon nitride membrane therefrom was carried out using a Plasma-Therm parallel plate reactive ion etch system. The dry etch process was carried out under reaction conditions of 15 milliTorr pressure and 150 watts etching power, the atmosphere being supplied as 8.5 sccm argon gas, 2.5 sccm $CHF_3$ gas, and 2.5 sccm $SF_6$ gas. An eight minute etch produced a semipermeable membrane through which gases flow easily, but liquids will not pass.

The resulting structure, shown in FIG. 2d, was quite robust, being able to withstand a pressure differential of some 10000 atmospheres, while remaining impermeable to water. This is much stronger than conventional porous structures, suggesting that the structures which make the silicon nitride layer semipermeable differ significantly from those of a normal porous material. The nature of this structural difference is not presently known to Applicants.

Many variations of the specific implementation described above will be clear to one skilled in the appropriate arts.

The scope of the invention is intended to be set by the claims as interpreted in light of the specification and drawings.

What is claimed is:

1. A process for fabrication of a semipermeable silicon nitride membrane, said process comprising forming a silicon nitride layer over a silicon wafer, then etching said layer until the semipermeable silicon nitride membrane is formed through which liquids will not pass although gases flow therethrough.

2. The process of claim 1, wherein said etching comprises applying a dry reactive ion etch.

3. The process of claim 1, further comprising fabricating a substrate support network from said silicon wafer to strengthen said semipermeable silicon nitride membrane.

4. A process for fabrication of a supported semipermeable silicon nitride membrane, said process comprising:

(a) depositing a silicon nitride layer on a first surface of a silicon wafer;

(b) etching the silicon wafer to form a substrate support network, thereby exposing the silicon nitride layer in a predetermined pattern; and (c) etching the silicon nitride layer until the semipermeable silicon nitride membrane is formed through which liquids will not pass although gases flow therethrough.

5. The process of claim 4, wherein etching the silicon wafer comprises applying a Bosch etching process.

6. The process of claim 4, wherein etching the silicon nitride layer comprises applying a dry reactive ion etch.

7. The process of claim 6, wherein the reactive ion etch takes place in an atmosphere comprising an inert gas, a fluorohydrocarbon, and sulfur hexafluoride.

8. The process of claim 6, wherein the reactive ion etch takes place in an atmosphere comprising argon, trifluoromethane, and sulfur hexafluoride.

* * * * *